(12) United States Patent
Okonogi et al.

(10) Patent No.: US 6,448,157 B1
(45) Date of Patent: Sep. 10, 2002

(54) FABRICATION PROCESS FOR A SEMICONDUCTOR DEVICE

(75) Inventors: Kensuke Okonogi; Takuo Ohashi, both of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/494,491

(22) Filed: Jan. 31, 2000

(30) Foreign Application Priority Data

Feb. 2, 1999 (JP) .......................................... 11-024747
Sep. 8, 1999 (JP) .......................................... 11-254974

(51) Int. Cl.$^7$ ........................................... H01L 21/322
(52) U.S. Cl. ...................... 438/471; 438/476; 438/402; 438/477; 438/795; 438/928
(58) Field of Search ................................ 438/143, 310, 438/402, 471, 475, 476, 477, 795

(56) References Cited

U.S. PATENT DOCUMENTS

| | | | | |
|---|---|---|---|---|
| 4,042,419 A | * | 8/1977 | Heinke et al. ................. 148/1.5 |
| 4,193,783 A | * | 3/1980 | Matsushita ...................... 65/31 |
| 4,622,082 A | * | 11/1986 | Dyson et al. ................... 148/33 |
| 4,661,166 A | | 4/1987 | Hirao .......................... 148/1.5 |
| 4,666,532 A | | 5/1987 | Korb et al. ................... 148/1.5 |
| 4,878,988 A | * | 11/1989 | Hall et al. ................... 156/600 |
| 4,897,154 A | * | 1/1990 | Chakravarti et al. ......... 156/643 |
| 5,506,176 A | * | 4/1996 | Takizawa ...................... 437/247 |
| 5,605,602 A | * | 2/1997 | DeBusk ........................ 438/476 |
| 5,789,308 A | * | 8/1998 | DeBusk et al. .............. 438/476 |
| 5,869,405 A | * | 2/1999 | Gonzalez et al. ............ 438/770 |
| 5,874,325 A | | 2/1999 | Koike ........................ 438/143 |
| 5,970,366 A | * | 10/1999 | Okonogi ....................... 257/629 |

FOREIGN PATENT DOCUMENTS

| | | | | |
|---|---|---|---|---|
| EP | 61-159741 | 7/1986 | ......... H01L/21/322 |
| EP | 0 373 273 | 6/1990 | ......... H01L/21/322 |
| EP | 0 604 234 | 6/1994 | ......... H01L/21/306 |
| JP | 361135128 A | * | 6/1986 | ................. 438/476 |
| JP | 5275299 | 10/1993 | ........... H01L/21/02 |
| JP | 06-021033 | 1/1994 | ......... H01L/21/304 |
| JP | 6021033 | 1/1994 | ......... H01L/21/304 |
| JP | 10247630 | 9/1998 | ......... H01L/21/304 |
| JP | 10256213 | 9/1998 | ......... H01L/21/304 |

* cited by examiner

*Primary Examiner*—John F. Niebling
*Assistant Examiner*—Angel Roman
(74) *Attorney, Agent, or Firm*—Hayes Soloway P.C.

(57) ABSTRACT

A surface of a substrate is oxidized at a temperature equal to or higher than 1050° C., or at a oxidation speed equal to or higher than 7.5 nm/min to form an oxide film with a thickness equal to or more than 1500 nm. when the oxide film is removed, a density of pits existent at the surface of a substrate is equal to or less than that prior to the oxidation treatment and a depth of a pit existent there is equal to or less than 50 nm. An element isolation withstand voltage can be prevented from lowering and a fabrication yield of a miniaturized, highly integrated semiconductor device can be improved.

12 Claims, 16 Drawing Sheets

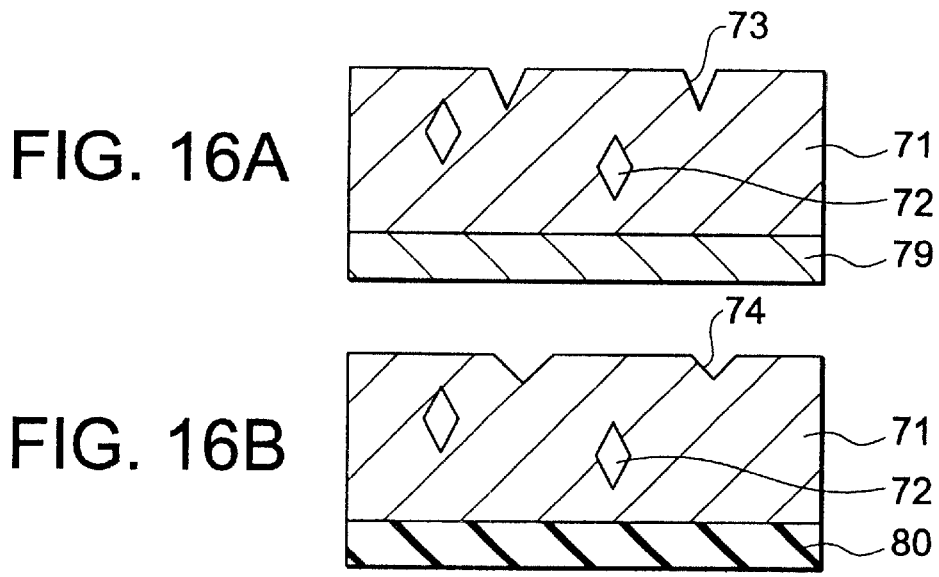
FIG. 16A
FIG. 16B
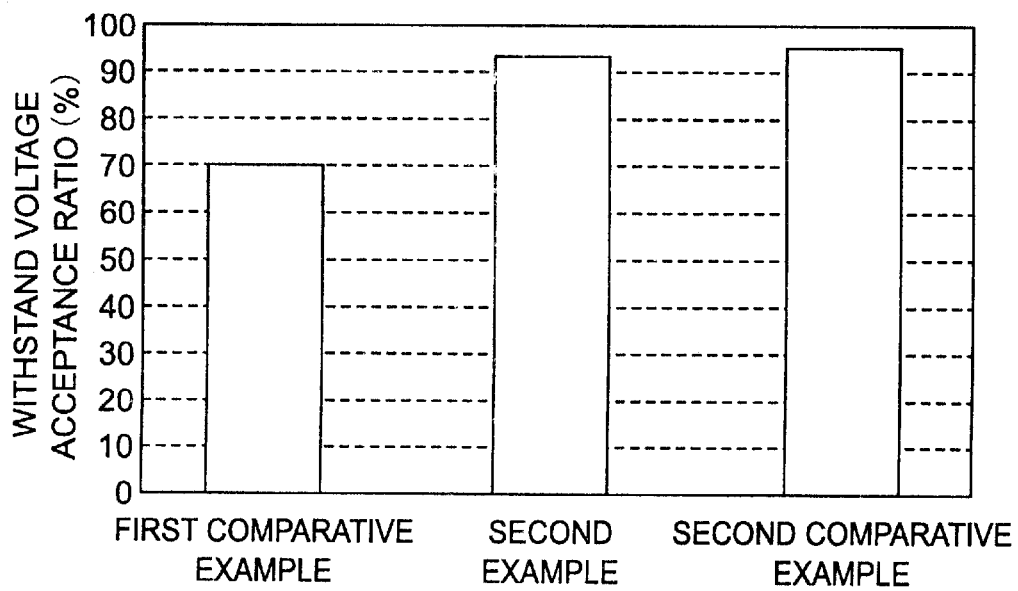
FIG. 17

… (1)

FABRICATION PROCESS FOR A SEMICONDUCTOR DEVICE

BACKGROUND OF THE INVENTION

1. Field of the Invention

The present invention relates to a semiconductor device such as DRAM (Dynamic Random Access Memory) and a fabrication process therefor. More particularly the present invention relates to a semiconductor device and a fabrication process therefor in which deterioration of an element isolation withstand voltage that is caused by a pit defect existing at a surface of a silicon substrate obtained by means of a Czochralski (Cz) method is prevented from occurring.

2. Description of the Related Art

FIG. 1 is a plan view showing a structure of a conventional DRAM, and FIG. 2 is a sectional view taken along line B—B of FIG. 1 and FIG. 3 is a sectional view taken along line C—C of FIG. 1. These figures show a state of a highly integrated DRAM memory cell in which a gate electrode being a word line has been formed. A P-type silicon substrate 1 has a major surface with an orientation of (100) and a resistivity of the order of 5 Ωcm. Further, this substrate 1 is a Cz silicon wafer with an orientation flat along the <110> direction. An element isolation insulating film 2 constituted of a silicon oxide film is formed by means of a LOCOS (Local Oxidation of Silicon) method on a major surface of the P-type silicon substrate and, for example, a device region 3 of a T shape is defined by the element isolation insulating film 2. Further, directions of sides of the device region 3 are parallel or perpendicular to the orientation flat and coincides with the <110> crystallographic orientation of the major surface of the silicon substrate 1. The device regions 3, that is active regions, are of a T shape each and arranged systematically across the major surface of the P-type silicon substrate.

A plurality of gate electrodes 5 each functioning as a word line of a memory cell are formed in parallel to one another on the surface of the substrate 1 with a thin gate oxide film 4 interposed therebetween. Further, an N-type diffusion layer 7 is formed in the device region 3 on the substrate surface by ion implantation of an N-type impurity with the gate electrode 5 and resist 11 thereon as a mask for gate patterning.

Then, description will be given of a fabrication process of the DRAM, especially of the step of forming an element isolation insulating film by means of the LOCOS method. FIGS. 4A to 4H are sectional views, in sequential steps, showing a method for forming a LOCOS oxide film in a conventional DRAM fabrication process. As shown in FIG. 4B, a thermal oxide film 12 is formed to, for example, a thickness of 10 nm on a surface of a silicon substrate 1 shown in FIG. 4A and, as shown in FIG. 4C, a silicon nitride film 13 is deposited on the thermal oxide film 12 with, for example, thickness of 120 nm.

Thereafter, as shown in FIG. 4D, the silicon nitride film 13 is patterned so as to produce a field pattern by means of a lithography technique.

Then, as shown in FIG. 4E, the surface of the substrate is thermally oxidized, for example, at 980° C. to form a field oxide film 2 to a thickness of, for example, 400 nm.

Subsequent to the thermal oxidation, as shown in FIG. 4F, the silicon nitride film 13 is removed and the silicon oxide film 12 beneath the silicon nitride film 13 is further removed.

Thereafter, as shown in FIG. 4G, boron ions 6 are implanted all over the wafer surface to form a channel stopper layer 14 under conditions of a dose at $1\times10^{12}/cm^2$ and an acceleration energy at 1000 keV.

After the ion implantation, as shown in FIG. 4H, ion implantation of an N-type impurity 16 is effected to form a diffusion layer 7 of the N-type impurity in the device region with the field oxide film 2 as a mask.

A series of the steps including formation of a field oxide film by means of the LOCOS method, formation of a gate electrode (a word line) and formation of a diffusion layer are repeated and a DRAM is eventually completed.

Generally, a semiconductor device has been miniaturized and highly integrated so as to increase a fabrication yield of chips obtained from a wafer. In a case of DRAM, a 16 Mbit DRAM has been fabricated under design rules of the minimum line width, the minimum element isolation width for insulation (a width of a field oxide film formed by means of the LOCOS method for isolating devices from one another) and a gate length, all at 0.5 μm. However, when a 64 Mbit DRAM is fabricated under the same dimension as those of a 16 Mbit DRAM, an area per chip becomes four times so that the number of chips obtained from a wafer decreases to one-fourth. For this reason, a 64 Mbit DRAM adopts design rules of the minimum line width, the minimum element isolation width for insulation and a gate length, all at 0.35 μm, so as to restrict a chip area to 1.5 times the chip area of a 16 Mbit DRAM and in turn prevent a chip yield from decreasing by a great margin.

In such a way, when dimensions in a plan is smaller, there arises a necessity to decrease a dimension in a height direction as well. Therefore, a thickness of the field oxide film was 400 nm for a 16 Mbit DRAM, but the thickness is decreased to 300 nm for a 64 Mbit DRAM, and a thickness of a gate oxide film is also decreased from 15 nm to 11 nm.

However, in such higher integration of a semiconductor device, an element isolation withstand voltage and a gate withstand voltage are deteriorated, which were not problematic for a conventional 16 Mbit DRAM, with the result that a problem has arisen because of increase in the number of defective chips.

SUMMARY OF THE INVENTION

It is an object of the present invention to provide a semiconductor device and a fabrication process therefor in which an element isolation withstand voltage can be prevented from lowering and a fabrication yield of a miniaturized, highly integrated semiconductor device can be improved.

A semiconductor device according to the present invention is constituted such that a surface of a substrate is subjected to an oxidation treatment at a temperature equal to or higher than 1050° C. to form an oxide film with a thickness equal to or more than 1500 nm and thereafter, the oxide film is removed, thereby decreasing a density of pits existing at the surface of a substrate to a value thereof equal to or less than a density of pits prior to the oxidation treatment.

Another semiconductor device according to the present invention is constituted such that a surface of a substrate is subjected to an oxidation treatment at an oxidation speed equal to or higher than 7.5 nm/min to form an oxide film of a thickness equal to or more than 1500 nm and thereafter, the oxide film is removed, thereby decreasing a density of pits existing at the surface of a substrate to a value thereof equal to or less than a density of pits prior to the oxidation treatment.

Still another semiconductor device according to the present invention is constituted such that a surface of a substrate is subjected to an oxidation treatment at a temperature equal to or higher than 1050° C. to form an oxide film of a thickness equal to or more than 1500 nm and thereafter, the oxide film is removed, thereby decreasing a depth of a pit existing at the surface of a substrate to a value equal to or less than 50 nm.

Yet another semiconductor device according to the present invention is constituted such that a surface of a substrate is subjected to an oxidation treatment to form an oxide film and thereafter, the oxide film is removed, thereby decreasing a depth of a pit existing at the surface of a substrate to a value equal to or less than 50 nm.

Further, a gettering film such as a polysilicon film can be formed on a back surface of the semiconductor substrate.

A fabrication process for a semiconductor device according to the present invention comprises the steps of oxidizing surfaces of a substrate at a temperature equal to or higher than 1050° C. to form oxide films each of a thickness equal to or more than 1500 nm; and thereafter, effecting element isolation of the surface of a substrate.

Another fabrication process for a semiconductor device according to the present invention comprises the steps of oxidizing surfaces of a substrate at an oxidation speed equal to or higher than 7.5 nm/min to form oxide films each of a thickness equal to or more than 1500 nm; thereafter effecting element isolation on the surface of a substrate.

In a case where a semiconductor device has a gettering film, such a device can be fabricated by means of a process comprising the steps of: after the step of forming the oxide films, removing only an oxide film formed on a back surface of the substrate by etching; depositing polysilicon films on both surfaces of the substrate; etching the substrate so as to remove the polysilicon film and the oxide film formed on the surface of the substrate while at least one portion of the oxide film on the surface of the substrate is preserved; and further etching the substrate using an etching liquid with which substantially no etching of silicon occurs so as to remove the preserved oxide film on the surface of the substrate.

Herein, the etching liquid with which substantially no etching of silicon occurs is, for example, hydrofluoric acid.

In the present invention, an oxide film of 1500 nm or thicker is formed and thereafter, a polysilicon film is deposited as a gettering film on a back surface of a substrate, wherein the polysilicon films are deposited on both surfaces of the substrate after only an oxide film on a back surface of the substrate is removed and thereafter, the polysilicon film on the surface of the substrate is removed by any of the steps of treatments, such as dry etching, CMP, polishing, and wet etching using a mixed liquid of nitric acid and hydrofluoric acid, wherein the oxide film formed beneath the polysilicon film on the surface of a substrate and the polysilicon film on the surface is removed while at least one portion of the oxide film on the surface of a substrate is preserved. With such a process, planarized pits at the surface of a substrate can be removed and voids in the bulk of the wafer can be prevented from appearing at the surface of a substrate so as not to increase Cops, increase of which would otherwise be observed, after polishing or wet etching using a mixed solution of hydrofluoric acid and nitric acid, or the like solution in order to remove a polysilicon film. Following removal of the polysilicon film, the preserved oxide film is etched off by wet etching with an etching liquid constituted of hydrofluoric acid or the like chemical with which substantially no etching of a silicon substrate occurs. Thereby, a semiconductor device with a sufficiently high gettering capability can be fabricated in a state of decreased COPs.

Still another fabrication process of the semiconductor device according to the present invention comprises the steps of giving performing a hydrogen treatment of a substrate at a temperature ranging from 1000° C. to 1300° C.; and, thereafter effecting element isolation of a surface of the substrate.

In a case where a semiconductor device has a gettering film, such a device can be fabricated by means of a process comprising the steps of: forming oxide films on both surfaces of a substrate after the hydrogen treatment; depositing polysilicon films on both surfaces of the substrate; etching the substrate so as to remove the polysilicon film and the oxide film formed on the surface of a substrate while at least one portion of the oxide film on the surface of a substrate is preserved; and further etching the substrate using an etching liquid with which substantially no etching of silicon occurs so as to remove the preserved oxide film on the surface of a substrate.

Yet another fabrication process of the semiconductor devise according to the present invention comprises the steps of: forming a silicon oxide film on a surface of the substrate or silicon oxide films on both surfaces thereof and giving the substrate a nitrogen treatment at a temperature ranging from 1000° C. to 1200° C., prior to a step of effecting element isolation of a surface of a substrate.

In a case where a semiconductor device has a gettering film, such a device can be fabricated by means of a process comprising the steps of: etching off only a silicon oxide film formed on a back surface of the substrate after the nitrogen treatment step; depositing polysilicon films on both surfaces of the substrate; etching the substrate so as to remove the polysilicon film and the oxide film formed on the surface of the substrate while at least one portion of the oxide film on the surface of the substrate is preserved; and further etching the substrate using an etching liquid with which substantially no etching of silicon occurs so as to remove the preserved oxide film on the surface of the substrate.

In such processes, COPs can be decreased even with a hydrogen or nitrogen treatment instead of an oxidation treatment and a gettering film such as a polysilicon film can also be formed on a back surface of a substrate.

BRIEF DESCRIPTION OF THE DRAWINGS

FIGS. 16A and 16B are sectional views showing a fabrication process for a semiconductor device on which a COP is planarized, using a silicon substrate on whose back surface a polysilicon is already deposited;

FIG. 17 is a histogram showing an effect of the second embodiment, where the second embodiment is compared with other embodiments.

DETAILED DESCRIPTION OF THE PREFERRED EMBODIMENTS

Figure 5A:
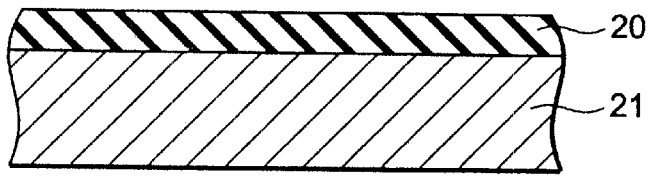
FIGS. 5A to 5F are sectional views, in sequential steps, showing a fabrication process for a semiconductor device according to a first embodiment of the present invention.

Detailed description will be made of an embodiment of the present invention with reference to the accompanying drawings. FIGS. 5A to 5F are sectional views, in sequential steps, showing a fabrication process for a semiconductor device according to a first embodiment of the present invention. As shown in FIG. 5A, when an oxide film 20 is necessary to be formed on a surface of a silicon substrate 21 prior to a step of forming a LOCOS oxide film, a thickness of the oxide film 20 is equal to or more than 1500 nm. The oxide film 20 is formed at an oxidation temperature equal to or higher than 1050° C., or at an oxidation speed equal to or higher than 7.5 nm/min.

Figure 5B:
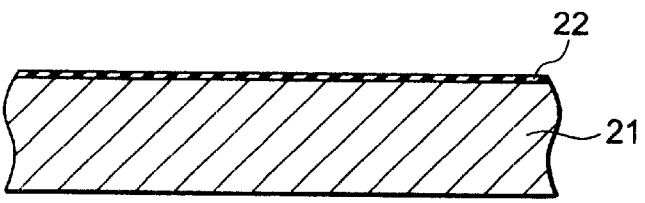
Figure 5C:
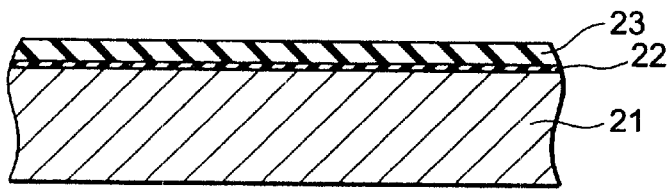
Figure 5D:
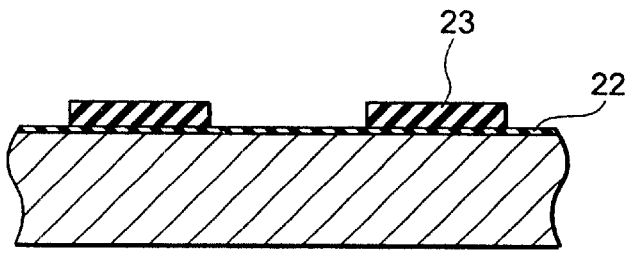

After the oxide film 20 is removed, process goes into the step of forming a LOCOS oxide film. In the step of forming the LOCOS film, similar to a conventional case, as shown in FIG. 5B, a thin thermal oxide film 22 with a thickness of, for example, 10 nm is formed on a substrate 1 and thereafter, as shown in FIG. 5C, a silicon nitride film 23 with a thickness of, for example, 12 nm is formed. Then, as shown in FIG. 5D, the silicon nitride film 23 is patterned to form a field pattern of the silicon nitride film 23.

Figure 5E:
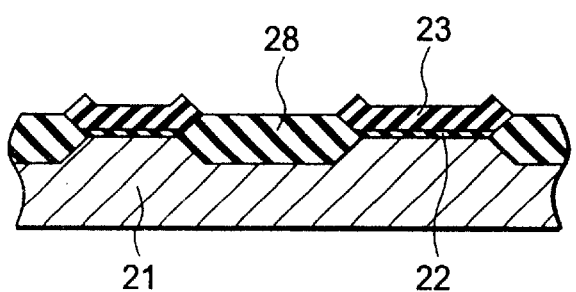
Figure 5F:
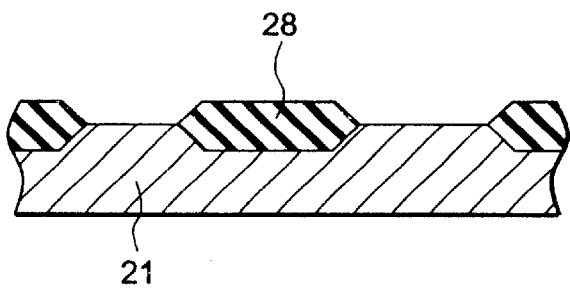

As shown in FIG. 5E, the surface of a substrate is heated, for example, at 980° C. to thermally oxidize, with the result that a field oxide film 28 with a thickness of, for example, 400 nm is grown. Thereafter, as shown in FIG. 5F, the silicon nitride 23 and the thin oxide film 22 are removed.

The field oxide film 28 formed in such a way is used as an element isolation insulating film to define device regions and, similar to a conventional case, each memory element is fabricated in a device region with means such as photolithography and ion implantation. In the memory element fabricated in this way, an element isolation withstand voltage exerted by the field oxide film 29 is extremely high.

The reason why will be explained below: The present inventors have conducted research through various kinds of experiments to investigate a cause for increase in the number of defective chips because of low levels of an element isolation withstand voltage or a gate withstand voltage that have conventionally been experienced in company with miniaturization of elements. As a result, the present inventors have found that when a cavity caused by a crystal defect (in the shape of an octahedron each of whose sides is 400=200 nm long) existent in the bulk of a silicon substrate is exposed at a surface of the substrate, the cavity is transformed to a COP (Crystal Originated Particle: which is a substrate pit caused by a crystal defect generated during growth of a substrate crystal) and that when a recess of an element isolation oxide film (a LOCOS oxide film) caused by this crystal defect exists in an element isolation region, there is produced a chip with a low element isolation withstand voltage, which is a cause for decrease in element isolation withstand voltage. Further, the present inventors have found that when a similar recess is generated directly below a gate electrode, it is a cause for a gate withstand voltage defect.

Figure 6A:
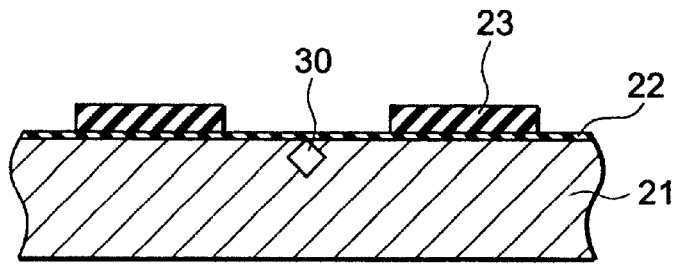
FIGS. 6A to 6F are sectional views illustrating a cause for reduction in element isolation withstand voltage caused by COPs.
Figure 6B:
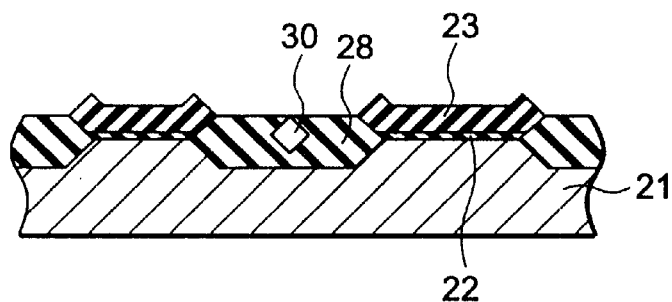
Figure 6C:
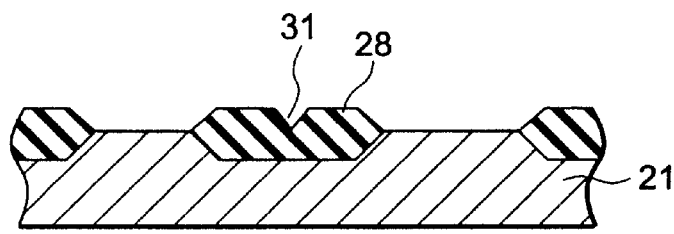

This crystal defect exists in the bulk of a silicon substrate produced by means of a Czochralski (Cz) method and if the crystal defect 30 resides in the vicinity of a surface of a silicon substrate 1 as shown in FIG. 6A, a crystal defect 30 is incorporated into the field oxide film 22 as shown in FIG. 6B when the field oxide film 28 is grown by thermal oxidation. Further, as shown in FIG. 6C, when the field oxide film 28 is etched off by tens of nm after growth thereof, the incorporated crystal defect 30 is exposed at the surface of the field oxide film 28 to form a recess 31. The field oxide film 28 is locally thinned in corresponding manner to a size of the recess 31.

Figure 6D:
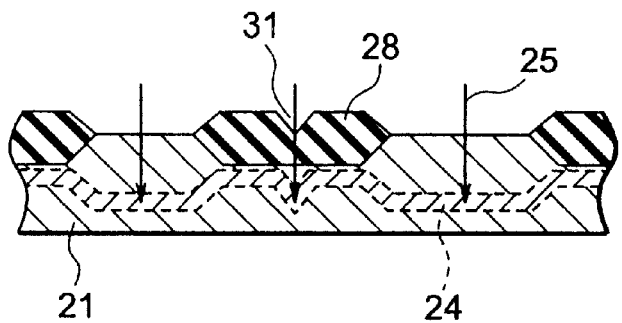
Figure 6E:
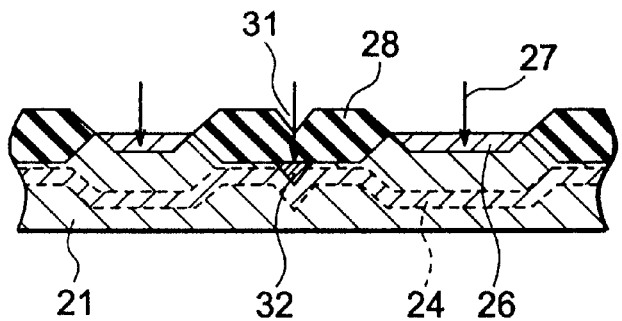

In this state, when boron ions 25 are implanted using a shield-through technique in order to form a channel stopper layer 24 as shown in FIG. 6D, a depth at which an implanted ion penetrates is larger at the recess 31 site by the size of the recess 31 than at the other portion, which leads to formation of a deeper channel stopper layer 24 there. That is, a low concentration region for a channel stopper is formed directly below the recess 31, under the field oxide film 28. In this state, when an N-type impurity 27 is ion-implanted in order to form a diffusion layer, as shown in FIG. 6E not only a diffusion layer 26 formed in a device region, but an N-type impurity is introduced in a low concentration region of channel stopper ions on the surface of a substrate direct below the recess 31 of the field oxide film 28 since the field oxide film 28 is thin at the recess 31, thus an inversion layer 32 is formed by the N-type impurity.

Figure 1:
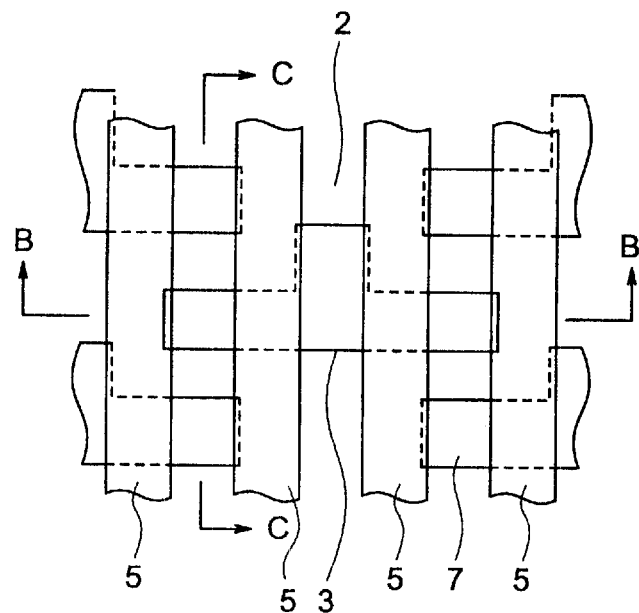
FIG. 1 is a plan view showing arrangement of electrodes and diffusion layers of a highly integrated DRAM.
Figure 2:
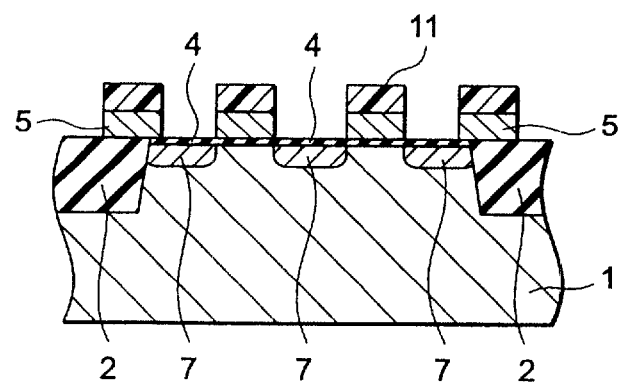
FIG. 2 is a sectional view taken along line B—B of FIG. 1.
Figure 3:
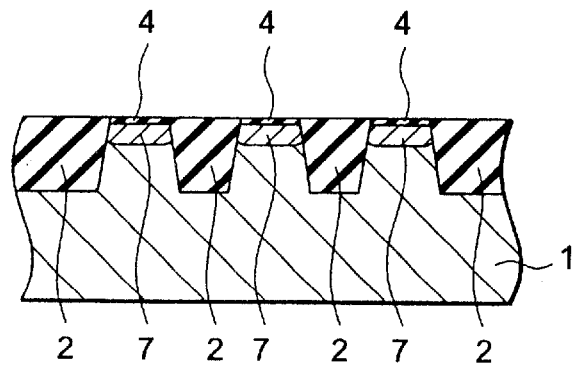
FIG. 3 is a sectional view taken along line C—C of FIG. 1.
Figure 4A:
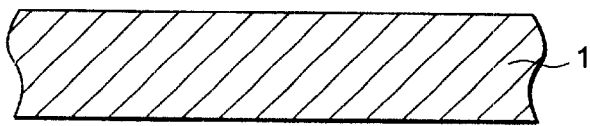
FIGS. 4A to 4H are sectional views sequentially showing steps of forming a LOCOS oxide film in a conventional DRAM fabricating process.
Figure 4B:
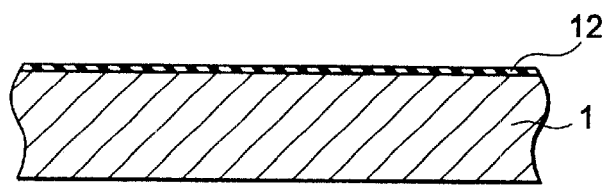
Figure 4C:
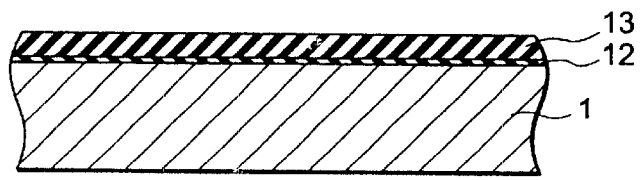
Figure 4D:
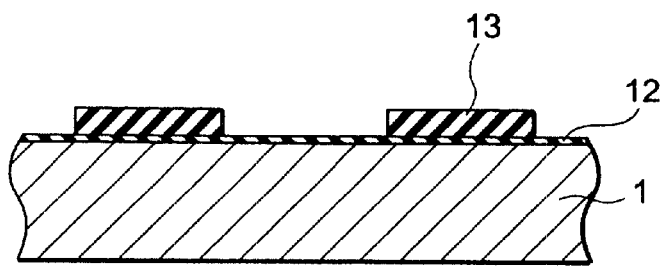
Figure 4E:
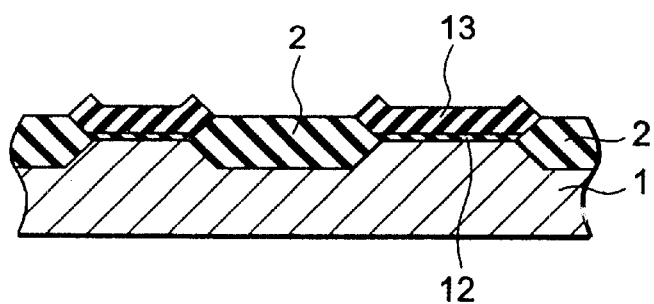
Figure 4F:
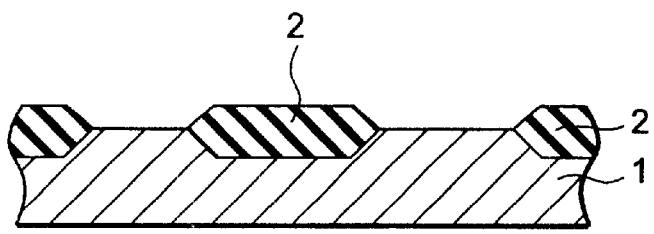
Figure 4G:
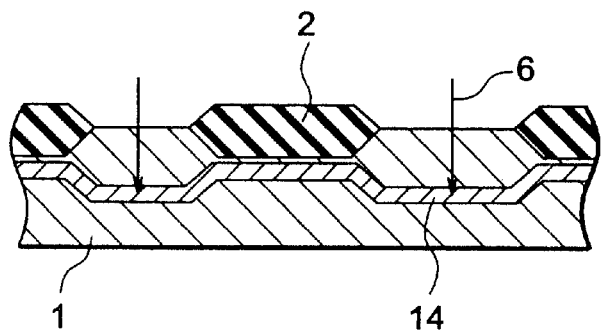
Figure 4H:
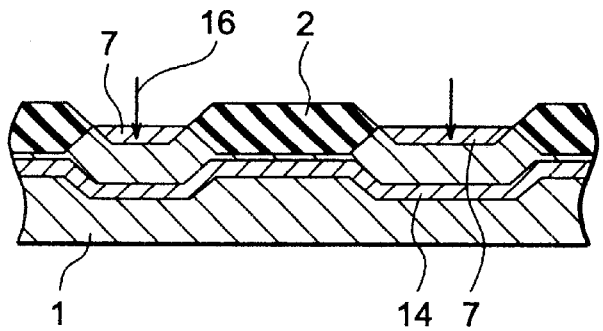
Figure 6F:
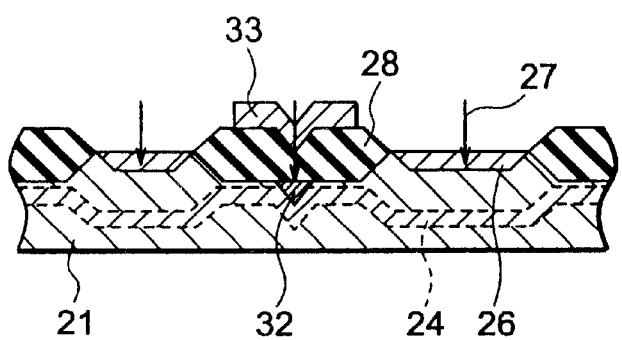

A charge leakage arises by formation of this inversion layer 32 and an element isolation withstand voltage is lowered, thereby generating a defective product. That is, as shown in FIG. 1 to FIG. 3, an electrode 5 as a word line passes over part of a field oxide film 2. Accordingly, if a recess 31 exists in the field oxide film over which the gate electrode is to pass, the gate electrode 33 is formed on the recess 31 as shown in FIG. 6F. In such a situation, the gate electrode 33, the inversion layer 32 therebelow and the thin part of the field oxide film 28 interposed therebetween cooperate to work as a transistor. Hence, when a voltage is applied to the gate electrode 33 in a memory operation, a depletion layer expands in the inversion layer 32, by which a current flows from the gate electrode 33 to a source diffusion layer 26, thus generating a leakage current.

Figure 7A:
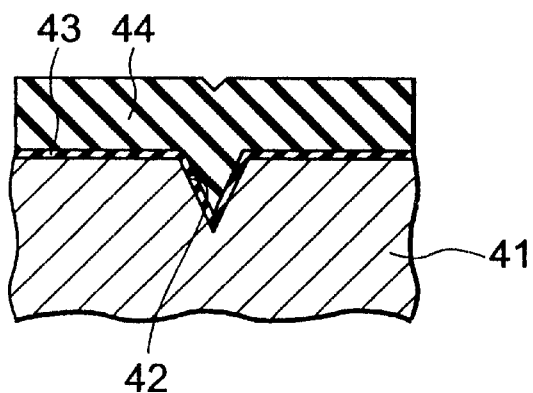
FIGS. 7A to 7D are sectional views showing a series of operations till a thin portion is formed in a LOCOS oxide film.
Figure 7B:
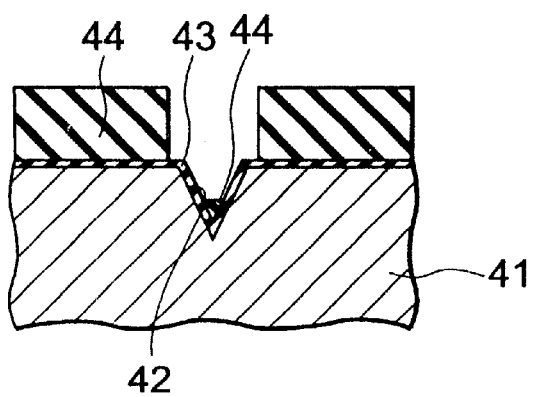
Figure 7C:
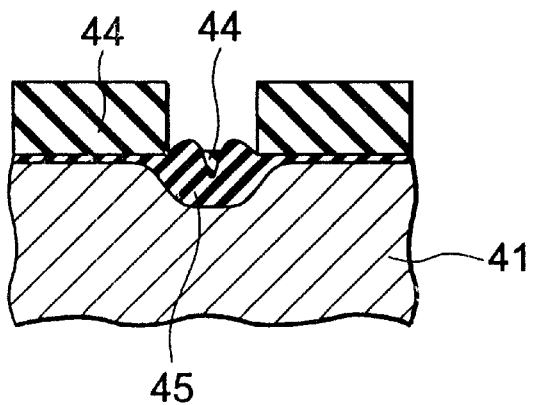
Figure 7D:
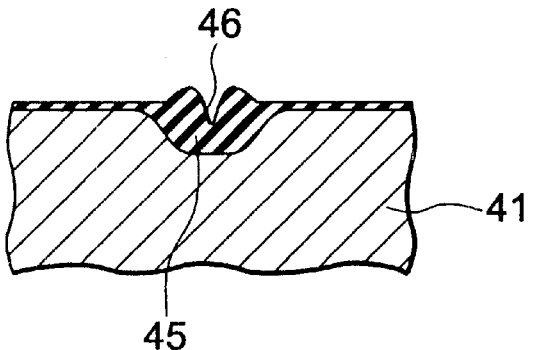

FIGS. 7A to 7D show a series of operations in which a thin portion 46 is formed in a LOCOS oxide film 45 by a COP 42. A case is considered where the COP 42 is exposed at a surface of a silicon substrate 41. AS shown in FIG. 7A, a pad oxide film 43 and a silicon nitride film 44 are formed on the silicon substrate 41 and then, as shown in FIG. 7B, the silicon nitride film 44 is locally removed in an element isolation region by means of plasma etching. Thereafter, as shown in FIG. 7C, the surface of a substrate is thermally oxidized with the silicon nitride film 44 remained as mask, thereby forming a LOCOS oxide film 45. In this case, the LOCOS oxide film 45 grows concave at a site where the COP 42 is located and the silicon nitride film 44 is left behind there. After the thermal oxidation, the silicon nitride 44 is removed by wet etching as shown in FIG. 7D and thereby, a device region is defined on the surface of a silicon substrate 41 by surrounding with the LOCOS oxide film 45. In this case, since the silicon nitride 44 present in the concave of the LOCOS oxide film 45 is also removed, a thin portion 46 is thus formed in the LOCOS oxide film 45.

Figure 8A:
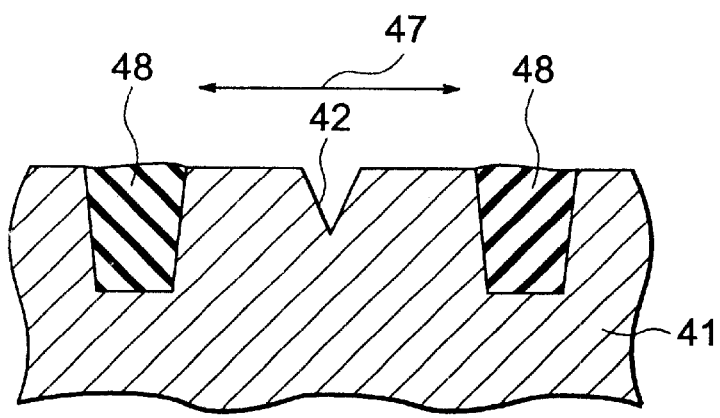
FIGS. 8A and 8B are sectional views showing a series of results of operations till a thin portion is formed in a gate oxide film when a COP whose corner is acute exists in a gate region.
Figure 8B:
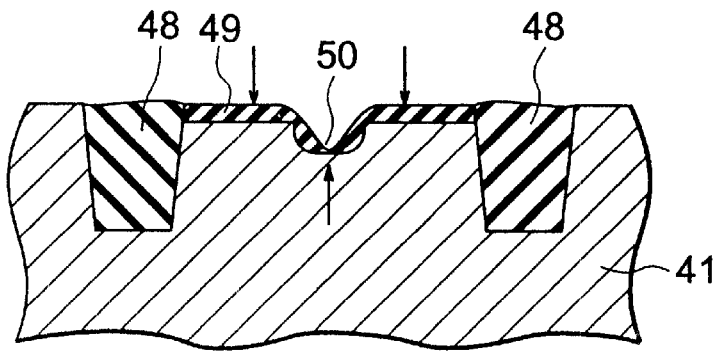

On the other hand, as shown in FIG. 8A, in the case where a COP 42 is present in a gate region 47 on which a gate electrode surrounded by an element isolation region 48 on a surface of a silicon substrate 41 is formed, when the gate oxide film 49 is formed on the surface of the gate region 47 by gate oxidation, as shown in FIG. 8B, at least one portion of an gate oxide film 49 grows into the interior from the surface of the silicon substrate and thereby a thickness of the gate oxide film 49 becomes thin at an acute corner of the COP 42. That is, when the COP 42, which is a recess caused by a crystal defect, is generated in the gate region 47 and the gate oxide film 49 is formed there, an oxide film growing in the bottom of the recess is thinner than any oxide film grown in other portions. Since a thin portion 50 of the oxide film 49 has an acute corner angle, concentration of an electric field arises, which in turn becomes causes for deterioration of a gate withstand voltage and dielectric breakdown.

Thus, the present inventors have found that a cavity formed by a crystal defect further causes deterioration of an element isolation withstand voltage, reduction in gate withstand voltage and in addition, dielectric breakdown.

Then, the present inventors have studied a process for reducing a recess 31 that affects characteristics of an element in an adverse manner. As a result, it has been found that a COP density that is exposed on a surface of a silicon substrate can be decreased by controlling oxidizing conditions through the steps till formation of a gate electrode and a recess 31 that is exposed on the surface of a silicon substrate can be planarized by rounding a profile of the recess 31. According to this finding, it has further been found that deterioration of an element isolation withstand voltage and reduction in reliability of a gate oxide film can be avoided.

Figure 10:
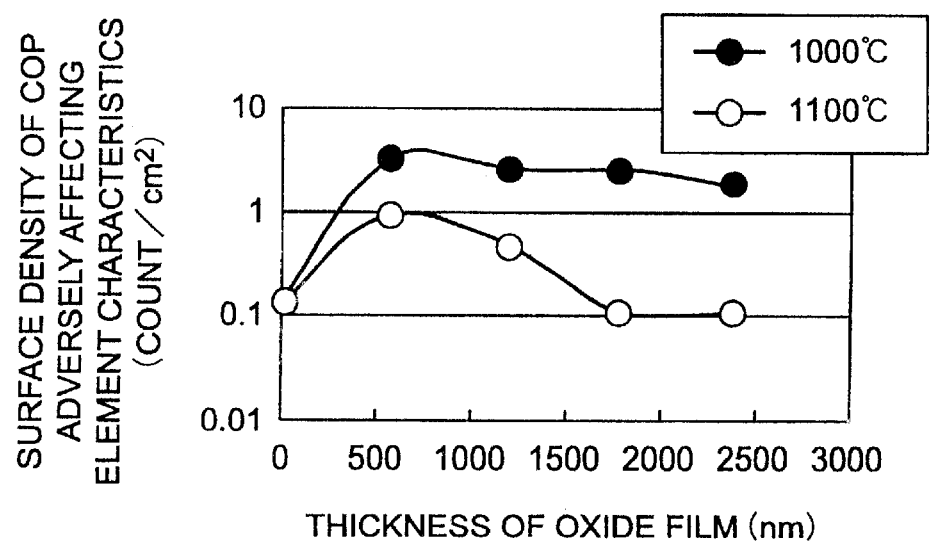
FIG. 10 is a graph showing an influence of an oxidation temperature on a relationship between a thickness of an oxide film and a COP.

FIG. 10 is a graph showing a relationship between a thickness of an oxide film when a silicon substrate was thermally oxidized at temperatures of 1000° C. and 1100° C. and a COP density that affected element characteristics in an adverse manner, wherein the abscissa is used for plotting values of the thickness (nm), while the coordinate is used for plotting values of a COP density ($1/cm^2$). The COP density of FIG. 10 indicates a COP density on a surface of a silicon substrate after an oxide film is removed and, accordingly, indicates a COP density at the interface between the oxide film and the silicon substrate. The oxidizing conditions adopted were ones in which silicon substrates were heated at various temperatures in a $H_2$—$O_2$ atmosphere and a COP density was measured by means of an optical defect inspection instrument on the market (for example, a model 2135 of KLA-TENCOR Inc.). The model 2135 of KLA-TENCOR Inc. was used in measuring conditions that a test mode was random mode, a pixel size was 0.25 µm and a threshold value was 15. As is apparent from FIG. 10, when heating is not performed, a COP density present at a surface of a silicon substrate is of the order of $0.2/cm^2$ and a COP density that affects device characteristics in an adverse manner is low independently from oxidizing conditions till a thickness of the oxide film reaches 100 nm However, as the oxide film is thicker, a COP density increases, and when the silicon substrate was heated at 1000° C., the COP density reaches the maximum value in the range from a thickness of a conventional field oxide film (400 nm) to a thickness in the neighborhood of 600 nm and however thicker the oxide film is than the range, almost no change in COP density occurs.

On the other hand, when a silicon substrate is heated at 1100° C., a COP density reaches the maximum at a thickness of the oxide film in the vicinity of 500 nm; in the range of a thickness more than 500 nm, a COP density decreases as a thickness of the oxide film increases; further with a thickness equal to or larger than 1500 nm, a COP density, which adversely affects device characteristics, drastically decreases by as much as one order of magnitude as compared with the maximum; and finally further decreases down to a COP density ($0.2/cm^2$) at a surface of a silicon substrate prior to the oxidation.

Figure 11:
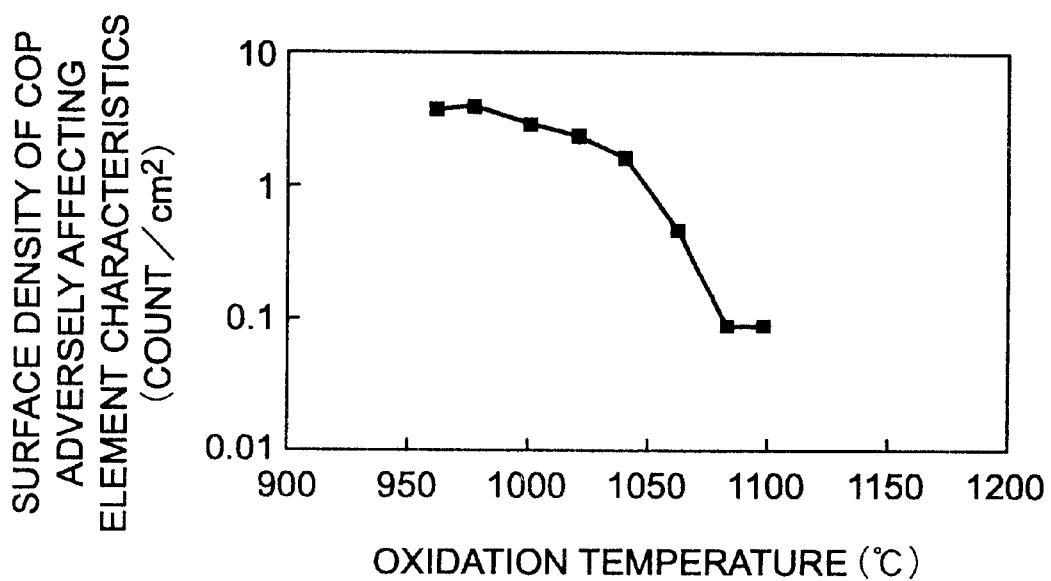
FIG. 11 is a graph showing a relationship between an oxidation temperature and a COP.

Further, FIG. 11 is a graph showing a relationship between an oxidation temperature plotted on the abscissa and a COP density that affected element characteristics in an adverse manner plotted on the coordinate. As shown in FIG. 11, when an oxidation temperature is lower than 1050° C., a COP density that adversely affects device characteristics is high, while when an oxidation temperature is equal to or higher than 1050° C., a COP density is extremely decreased.

Figure 12:
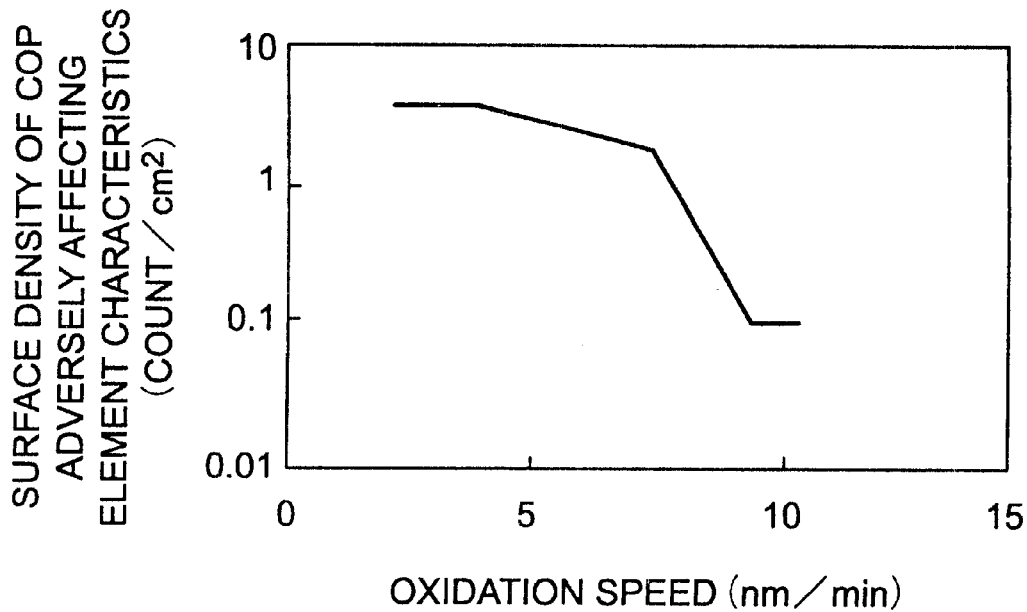
FIG. 12 is a graph showing a relationship between an oxidation speed and a COP.

Further, FIG. 12 is a graph showing a relationship between an oxidation speed plotted on the abscissa and a COP density that affected element characteristics in an adverse manner plotted on the coordinate. As shown in FIG. 12, when an oxidation speed is equal to or higher than 7.5 nm/min, a COP density that adversely affects device characteristics tremendously decreases as compared with when an oxidation speed is less than 7.5 nm/min.

Therefore, in the present invention, a surface of a silicon substrate of a semiconductor device such as DRAM is oxidized, prior to formation of a field oxide film, at on oxidation temperature equal to or higher than 1050° C., or at an oxidation speed equal to or higher than 7.5 nm/min in order to grow a silicon oxide film on the surface of a silicon substrate to a thickness of equal to or more than 1500 nm. The silicon oxide film formed prior to formation of a field oxide film may be grown in a single operation. or in a plurality of operations. An oxidation atmosphere may be a $H_2$—$O_2$ atmosphere, a halogen gas atmosphere or the like and a high pressure may be applied in the oxidation.

Figure 13:
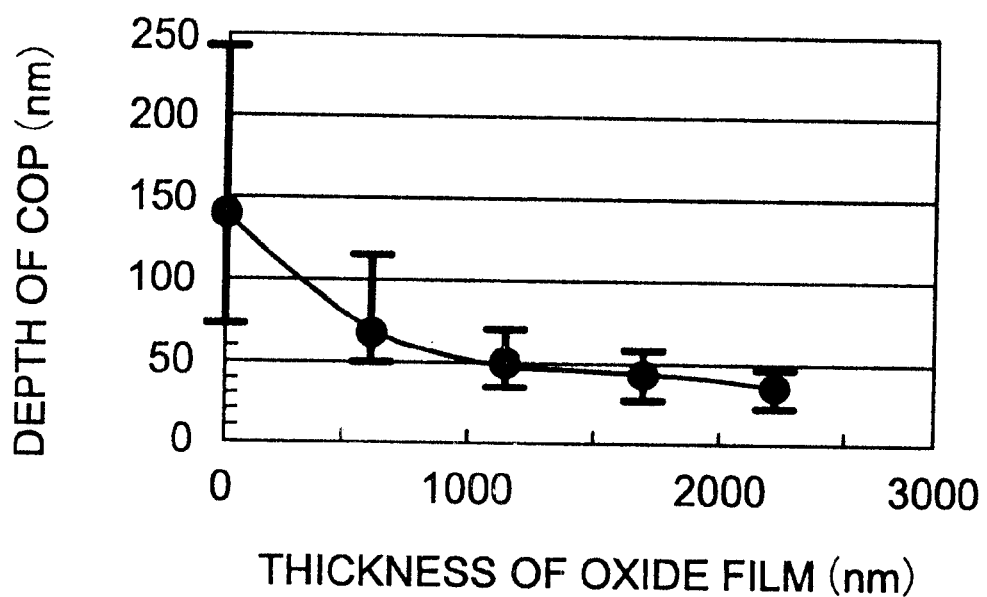
FIG. 13 is a graph showing a relationship between a thickness of a silicon oxide film and a depth of a COP.

A drastic reduction of a COP density in oxidation at an oxidation temperature equal to or higher than 1050° C., or at an oxidation speed equal to Or higher than 7.5 nm/min occurs by a planarization phenomenon of a COP exposed at the surface of a silicon substrate as one of causes. FIG. 13 is a graph showing a relationship between a thickness (nm) of a silicon oxide film plotted on the abscissa and a depth of a COP plotted on the coordinate. As shown in FIG. 13, when a thickness of the silicon oxide film is equal to or more than 1500 nm, a depth of a COP is equal to or less than 50 nm. Hence, in the present invention, a silicon oxide film is grown to a thickness equal to or more than 1500 nm in order to reduce a depth of a COP to be equal to or less than 50 nm. With application of the conditions, reduction in element isolation withstand voltage due to a COP can be prevented from occurring.

Figure 14A:
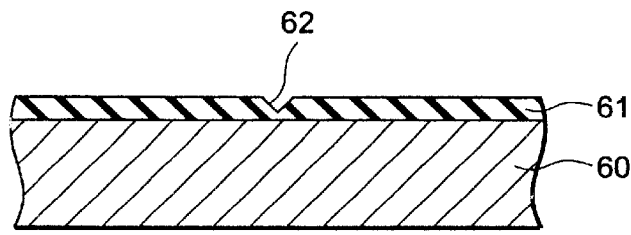
FIGS. 14A and 14B are sectional views showing a relationship between a thickness of an oxide film and a depth of a COP.
Figure 14B:
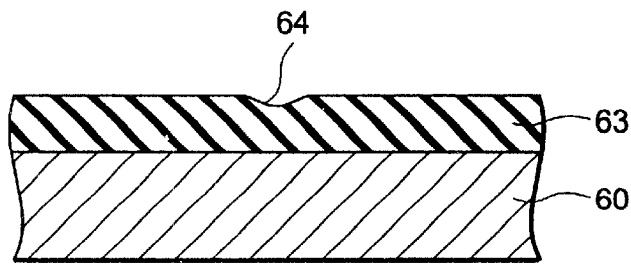

As shown in FIG. 14A, when a silicon substrate 60 is heated at 1000° C. to form a silicon oxide film 61 with a thickness of the order of 500 nm, which is of the order of a thickness of a conventional field oxide film, on a surface of the silicon substrate 60, then a recess 62 formed by a COP which is a crystal defect having the shape of an octahedral cavity has an acute corner. However, as shown in FIG. 14B when a silicon substrate 60 is heated at 1100° C. to form a silicon oxide film 63 of 1500 nm or more in thickness, then an oxidation speed is fast and thereby a crystal defect has a round corner, with the result that a recess 64 caused by a COP is shallow.

On the other hand, since octahedral cavities (each the cause for a COP) dispersed in a uniform manner throughout in the bulk of a silicon substrate become increasingly exposed in company with progress of oxidation of the substrate, therefore a total number of COPs existent at a surface of the substrate would increase with increase in oxidation amount. However, since oxidation injects a number of interstitial silicon atoms into the interior of the silicon substrate, an octahedral cavity is filled with interstitial silicon atoms and becomes extinct. Furthermore, since oxidation by $H_2$—$O_2$ gas at high temperature has a high speed, a concentration of interstitial Si atoms at an interface between an silicon oxide film and a silicon substrate is high. Contrary to this, when an oxidation speed is low, interstitial Si atoms injected for a unit time is small in number and thereby, a difference between the injection into the interior of the substrate and the diffusion toward the back surface of the substrate is minimized with the result that an interstitial Si atom concentration at the silicon oxide film/silicon substrate interface becomes low. Hence, the high temperature $H_2$—$O_2$ gas oxidation facilitates octahedral cavities existent in the silicon region of the oxide film/silicon substrate interface to become extinct.

As described above, since when oxidation is effected at a temperature equal to or higher than 1050° C., or at a speed equal to or higher than 7.5 nm/min, crystal defects existent in the silicon region of a silicon oxide film/silicon substrate interface decreases in number, therefore crystal defects at an exposed surface of the silicon substrate decreases in number after the oxide film is removed by etching or the like treatment to expose the surface of the silicon substrate. Accordingly, when the substrate surface treated as described above is thermally oxidized to form a field oxide film, the field oxide film has only a small influence from COPs that adversely affects device characteristics on a surface of the field oxide film. Further, a gate oxide film is also hard to be separated from a substrate, thereby increasing reliability of a gate oxide film.

Figure 9A:
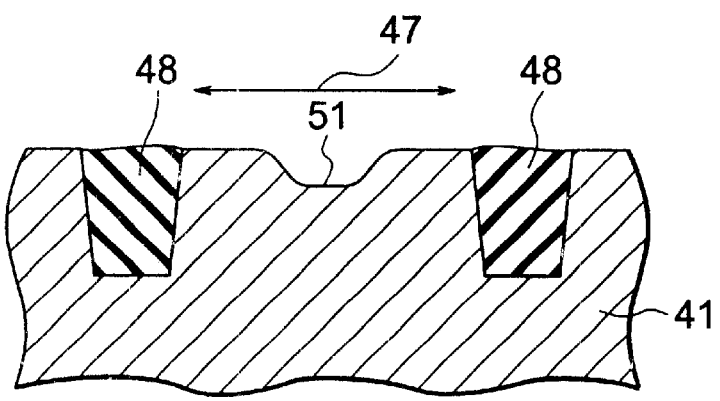
FIGS. 9A and 9B are sectional views showing a series of results of operations in which no change occurs in thickness of a gate oxide film formed in a gate region when a COP whose corner is rounded exists in a gate region.
Figure 9B:
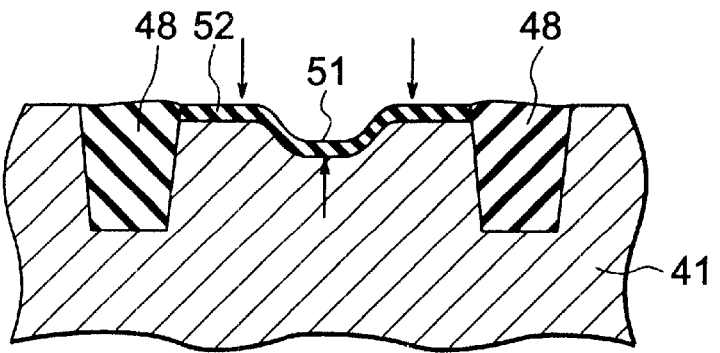

Furthermore, as shown in FIG. 9A, in the present invention, an acute corner of a COP existent in a gate region 47 is transformed to a recess 51 having a round bottom profile and when a gate oxide film 52 is formed on the gate region 47, the gate oxide film 52 is formed in a normal way without any thinning effect on the film even in the recess 51, as shown in FIG. 9B. Since a COP existent in a gate oxide film formation region is rounded and planarized in its profile, a gate oxide film formed in such a recess 51 with a round profile is hard to be locally thinned, leading to the result that a concentrated electric field is hard to occur at a gate electrode when in voltage application. Hence, with application of the present invention, deterioration of a gate withstand voltage and dielectric breakdown are prevented from occurring.

It should be appreciated that as a size of a COP increases, an oxide film is required to grow to a larger thickness, while as a size of a COP decreases, an oxide film may grow to a smaller thickness.

Then, description will be made of a second embodiment of the present invention. This embodiment describes a fabrication process for a semiconductor device in which a polysilicon film as a gettering film was formed on a back surface of a silicon substrate, while COPs existent at the surface thereof are planarized.

FIGS. 15A to 15F are sectional views, in sequential steps, showing a fabrication process for a semiconductor device according to this embodiment. The embodiment is proceeded as follows; An oxide film for planarization of COPs of a silicon substrate is formed prior to formation of a LOCOS oxide film and subsequently, a polysilicon film is deposited on a back surface of a substrate, followed by removal of the oxide film.

Figure 15A:
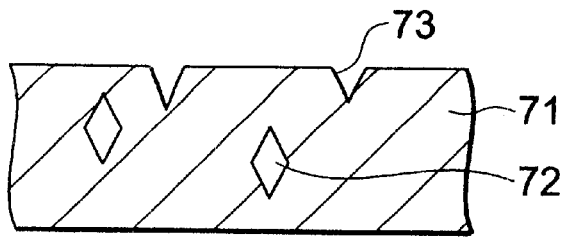
FIGS. 15A to 15F are sectional views, in sequential steps, showing a fabrication process for a semiconductor device according to a second embodiment of the present invention.

As shown in FIG. 15A, crystal defects 72 each in the shape of an octahedron are existent in the bulk of a silicon substrate 71 and COP 73 that are each formed by exposure of the cavity of a crystal defect are existent at a surface of the silicon substrate 71.

Figure 15B:
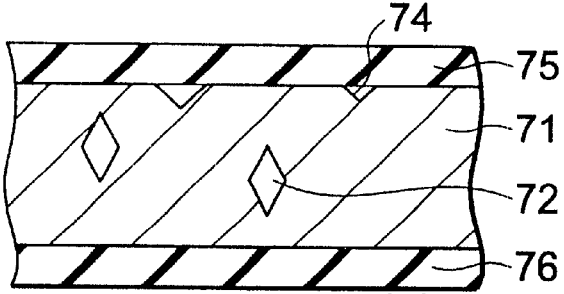

First, as shown in FIG. 15B, silicon oxide films 75 and 76 each of a thickness equal to or more than 1500 nm is formed on both surfaces of the silicon substrate 71 in a similar way of the first embodiment in order to planarize COP 73. In this operation, COP 73 existent at a surface of the silicon substrate 71 is planarized and transformed to a recess 74 whose corner is rounded.

Figure 15C:
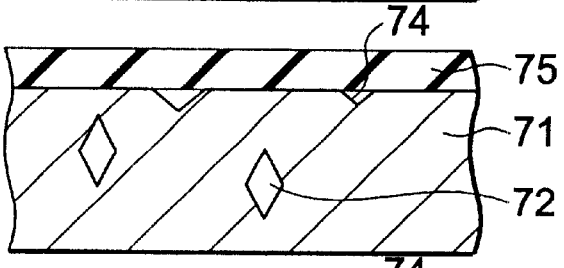

Following the oxidation, as shown in FIG. 15C, only the silicon oxide film 76 on the back surface of the silicon substrate 71 is removed by back surface oxide film etching (spin etching).

Figure 15D:
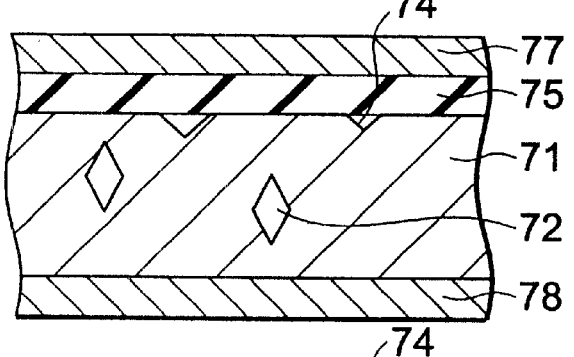

As shown in FIG. 15D, after removal of the oxide film, polysilicon films 77 and 78 are deposited on both surfaces of the silicon substrate 71 by means of CVD (Chemical Vapor Deposition) or the like.

Figure 15E:
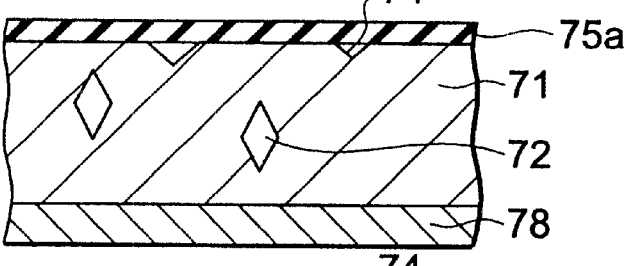

Then, as shown in FIG. 15E, the polysilicon film 77 and silicon oxide film 75 on the surface of the silicon substrate 71 are removed. In this operation, at least one portion of the oxide film 75 on the silicon substrate 71 is preserved. As a method for removing the polysilicon film 77 and oxide film 75 on the surface of the silicon substrate 71, for example, dry etching, chemical mechanical Polishing (CMP), polishing or wet etching using a mixed liquid including hydrofluoric acid and nitric acid. In a case where the polysilicon film 77 is removed using a mixed liquid including hydrofluoric acid and nitric acid or the like liquid, a protective film or the like is formed on the polysilicon film 78 on the back surface of the silicon substrate such that the polysilicon film 78 is not removed together with the polysilicon film 77 on the surface of the silicon substrate.

Figure 15F:
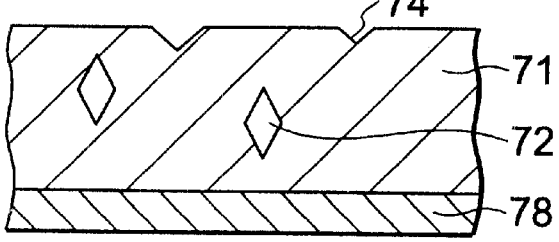

AS shown in FIG. 15F, subsequent to removal the polysilicon film, the silicon oxide film 75a remained on the surface of the silicon substrate 71 is removed using an etching liquid with which substantially no etching of the silicon substrate 71 occurs. As such etching liquid, there is a hydrofluoric acid solution, for example, and the recess 74 planarized in a high temperature oxidation treatment does not disappear in this etching since the hydrofluoric acid solution substantially does not etch the silicon substrate 71.

Through the above described process, since COP 73 of the silicon substrate 71 are planarized in the step of forming an oxide film of a thickness equal to or more than 1500 nm at an oxidation temperature equal to or higher than 1050° C. or at an oxidation speed equal to or higher than 7.5 nm/min and after the high temperature treatment step, the polysilicon film 78 is formed on the back surface of the silicon substrate, therefore a semiconductor device can also be fabricated with not only decreased COPs that are detected as defects, but a sufficiently high gettering capability.

Next, description will be made of the reason why the etching of the polysilicon film 77 and silicon oxide film 75, both formed on a surface of a silicon substrate 71, is half way stopped such that part of the silicon oxide film 75 is preserved. A case is considered where a polysilicon film is formed directly on a silicon substrate without a silicon oxide film on a surface of the substrate. When the polysilicon film on the surface of a silicon substrate is removed, similar to the first embodiment, by polishing or wet etching with a mixed liquid including hydrofluoric acid and nitric acid or the like liquid, stock removal reaches up to as far as the surface of a silicon substrate while being exposed by the polishing or wet etching with a mixed liquid including hydrofluoric acid and nitric acid or the like liquid and thereby COPs that have been planarized by high temperature oxidation disappear due to the stock removal. Furthermore, crystal defects included in the bulk of the silicon substrate come to appear at the surface of a silicon substrate, which in turn, increases a density of COPs to be detected as defects. Accordingly, in order that a polysilicon film is removed by etching while planarized COPs at the surface of a silicon substrate are retained, it is a necessity that a film such as a silicon oxide film is formed and with the film, the surface of a silicon substrate is prevented from etching off.

In addition, description will be made of the reason why a polysilicon film for gettering is formed after the high temperature oxidation treatment step as described above. FIGS. 16A and 16B are sectional views showing a fabrication process for a semiconductor device on which a COP is planarized, using a silicon substrate on whose back surface a polysilicon is already deposited. In FIGS. 16A and 16B, the same constituents of a structure as those in FIGS. 15A to 15F are indicated by the same reference numeral and detailed description thereof is not made.

As shown in FIG. 16A, a polysilicon film 79 is formed on a back surface of a silicon substrate 71 as a gettering film, and some crystal defects 72 are exposed at the surface of the silicon substrate 71 as COP 73 and some crystal defects 72 are included in the interior of the silicon substrate 71. An silicon oxide film with a thickness equal to or more than 1500 nm is formed by means of a method similar to that of the first embodiment in order to planarize the COP 73 of the silicon substrate 71.

Next, as shown in FIG. 16B, when the oxide film is removed, observation is such that a COP 73 of the silicon substrate 71 has been planarized and transformed to a recess 74 whose corner is rounded. in the step of forming the oxide film, a polysilicon film 79 on the back surface of the silicon substrate is oxidized to form a crystallized silicon oxide film 80.

When a high temperature oxidation treatment is applied to the silicon substrate 71 on whose back surface the polysilicon film 79 is already formed, the polysilicon film 79, which is a gettering film, Is oxidized to form a crystallized silicon oxide film 80, leading to loss of the gettering capability of the polysilicon film 79. Therefore, a polysilicon film for gettering is required to be again deposited on the back surface of the silicon substrate.

In the embodiment, the polysilicon film on the back surface of the silicon substrate 71 is not crystallized since the polysilicon film is deposited after the high temperature oxidation treatment step of the substrate, thus retaining the gettering capability.

FIG. 17 is a histogram showing an effect of the second embodiment wherein the second embodiment is compared with other embodiments. A silicon substrate that was used in the embodiment was one on whose back surface a polysilicon film as a gettering film was deposited after receiving a high temperature oxidation treatment. A substrate that was used in a first comparative example was prepared in such a manner that a polysilicon film for gettering was deposited on a back surface of a silicon substrate and the substrate thus deposited with the polysilicon film was subjected to procedures of the first embodiment. A substrate that was used in a second comparative example was an IG substrate (hereinafter referred to as a DZIG substrate) in which a denuded zone (DZ) capable of an intrinsic gettering (IG) capability was formed. The above described substrates on which procedures of the comparative first and second embodiments and the embodiment were respectively effected were subjected to tests on intentional contamination of Fe and acceptance ratios of initial withstand voltages of gate oxide films caused by a hydrogen treatment. Therefore, in the embodiment, planarization of a COP at a surface of a silicon substrate was performed: A hydrogen treatment was conducted in order to reduce a lattice defect having the shape of an octahedron, caused by a COP included in the interior of the substrate.

An evaluation method for the withstand voltage acceptance ratio was such that first, intentional Fe contamination was effected on a silicon substrate just before gate oxidation and a MOS (Metal Oxide Semiconductor) capacitor was prepared. The intentional contamination is effected using a dip contamination technique and in this case, a contamination concentration was $5 \times 10^{11}/cm^2$. A gate oxide film was formed in $H_2$—$O_2$ atmosphere at 800° C. to a thickness of 8 nm. An evaluation was performed on an initial oxide film withstand voltage and a measurement area was 500 $\mu m^2$.

As shown in FIG. 17, a withstand voltage acceptance ratio in the first comparative example was 70%, while a withstand voltage acceptance ratio was 90% or higher in the embodiment. Further, it is seen from the graph that a withstand voltage acceptance ratio increases to a level equal to that of a DZIG substrate as an effect of deposition of a polysilicon film on the back surface of a substrate.

The following is description of a third embodiment of the present invention. In the first and second embodiments, a silicon substrate was subjected to a high temperature oxidation treatment in order to planarize a COP and reduce a COP density. The present inventors acquired a fact that such planarization of a COP was caused by a hydrogen treatment. Therefore, in the embodiment, planarization of a COP at a surface of a silicon substrate was performed: A hydrogen treatment was conducted in order to reduce a lattice defect having the shape of an octahedron, caused by a COP included in the interior of the substrate.

The silicon substrate was hydrogen-treated at a high temperature prior to an element isolation step, similar to the second embodiment. The temperature in this treatment was in the range of from 1000° C. to 1300° C. Further, a treatment period was, for example, 1 hr.

Next, description will be made of a mechanism of planarization of a COP at the surface of a substrate and extinction of an octahedral cavity in the interior of the substrate. In a hydrogen treatment step, the silicon substrate is not oxidized but reduced. Si atoms are easy to move and migrate on the surface of the substrate that has been reduced and an acute corner of a COP at the surface thereof is filled with moving Si atoms so as to round an acute corner thereof, thus forming a recess which has a round bottom profile. The reason why octahedral cavities in the interior of the substrate becomes extinct or reduced in a number is that a solid solubility of vacancies and interstitial Si atoms in the bulk of the silicon substrate increase because of a high temperature of the hydrogen treatment. In the oxidation treatment, Si is settled in a chemical form of $SiO_2$, which results in expansion in volume of occupancy associated with one Si atom about twice, and thereby excess Si atoms are expelled into a space in the vicinity of the transformation. Such expelled Si atoms are used in filling octahedral cavities in the bulk of the silicon substrate, leading to extinction or reduction of the cavities. In the hydrogen treatment of the embodiment, a solid solubility of interstitial Si atoms increases by high temperature heat treatment and a solid solubility of vacancies increases simultaneously. That is, at a high temperature, many of Si atoms each located at a lattice point are migrated to interstitial points since the Si atoms each at a lattice point in the Si substrate have a thermal energy. Octahedral cavities are filled with many of the Si atoms at interstitial points in supply, whereby cavities are contracted or become extinct. Further, octahedral cavities are also dissolved into surrounding bulk of the silicon substrate to extinction thereof since a solid solubility of vacancies in the bulk of the silicon substrate increases.

Through such phenomena, similar to the first embodiment, a COP with an acute corner at the surface of the substrate is planarized and not only the COPs at the surface of the substrate are each transformed to a recess whose corner is rounded, but crystal defects that are present in the interior of the substrate in the vicinity of the surface thereof and each of which are in the shape of an octahedral cavity can also be contracted or decreased.

As described above, a conclusion is such that since solid solubilities of interstitial Si and vacancies in the bulk of a silicon substrate increase as a treatment temperature is raised, therefore a higher temperature in a hydrogen treatment is preferred and furthermore, a longer treatment time period is also preferred in order to accelerate such a mechanism for planarization of a COP. At a temperature lower than 1000° C., solid solubilities of interstitial Si atoms and vacancies are not raised as much as expected, therefore, effects of contracting a size or reducing the number of octahedral defects (a cavity defect) caused by COPS are diminished. On the other hand, if a treatment temperature is higher than 1300° C., a silicon substrate is warped due to a self-weight, which is a cause to generate slippage with ease. Accordingly, a treatment temperature in a hydrogen treatment is preferably in the range of from 1000° C. to 1300° C.

Further, when a gettering film is formed on a back surface of a silicon substrate similar to the second embodiment, the silicon substrate is subjected to a hydrogen treatment prior to an element isolation step of a surface of the silicon substrate and thereafter, a silicon oxide film or silicon oxide films are formed on the surface or both surfaces of the silicon substrate each to, for example, a thickness ranging from 100 to 1000 Å. It should be appreciated that a thickness of the silicon oxide film may be, for example, in the range of from about 50 to about 10000 Å, or preferably in the range of from about 100 to about 1000 Å, taking simplicity, easiness and a throughput in fabrication and others into consideration in the latter case.

When silicon oxide films are formed on both surfaces of a silicon substrate, only the oxide film on the back surface is removed by etching. Next, polysilicon films are deposited on both surfaces of the silicon substrate by mans of a CVD method or the like method. Thereafter, the polysilicon film and silicon oxide film on the surface of the silicon substrate are removed while at least one portion of the oxide film on the surface is preserved. After removal of the films, the preserved oxide film is removed by etching using an etching liquid with which substantially no etching of the silicon substrate occurs so as to be able to obtain a semiconductor device similar to that obtained in the second embodiment. That is, in the etching of the preserved oxide film, since the silicon substrate is not etched in spite of removal of the preserved oxide film, COPs planarized by the hydrogen treatment at the surface of the silicon substrate are left behind with no extinction thereof while a polysilicon film as a gettering film is formed on the back surface of the silicon substrate.

When a semiconductor device such as a memory element of the first embodiment are fabricated using a silicon substrate thus prepared, a semiconductor device with a high gettering capability can be fabricated since octahedral cavities included in the bulk of the silicon substrate are decreased and COPS at a surface of the silicon substrate are planarized, and at the same time, a polysilicon film is formed on the back surface of the silicon substrate.

The following is description of a fourth embodiment according to the present invention. In the embodiment, a nitrogen treatment was effected in order to reduce COPs of a silicon substrate. In the nitrogen treatment as well, the COPs were reduced in a mechanism similar to that in the hydrogen treatment. In the embodiment as well, a gettering film constituted of polysilicon was able to be formed on a back surface of a semiconductor substrate whose COPs were reduced by the nitrogen treatment.

The process is as follows: A silicon oxide film or silicon oxide films each of, for example, a thickness ranging from 100 to 1000 Å are formed on a surface or both surfaces of a substrate prior to the step of element isolation of the surface of a substrate. It should be appreciated that a thickness of the oxide film may be, for example, in the range of from about 50 to about 1000 Å, taking simplicity, easiness and a throughput in fabrication and others into consideration in the latter case. Following the formation of the oxide film or oxide films, the silicon substrate is subjected to the nitrogen treatment at a temperature ranging from 1000° C. to 1200° C. Further, a treatment time period is, for example, 1 hr or the like. When a surface of a substrate is nitrogenated in a naked state, the surface of a substrate becomes extremely roughened. However, the surface of the silicon substrate is not roughened by forming an oxide film on the surface in advance in such a manner. Furthermore, the acute comers of COPs at the surface of the silicon substrate are planarized and transformed to recesses whose comers are rounded.

Then, after only the oxide film on a back surface of the silicon substrate is removed, polysilicon films are deposited on both surfaces of the substrate. Following the deposition of polysilicon films on both surfaces, the polysilicon film and oxide film on the surface are removed while at least one portion of the oxide film is preserved. Thereafter, the preserved oxide film is etch-removed using an etching liquid with which substantially no etching of the silicon substrate occurs, thereby enabling a semiconductor device similar to those obtained in the second and third embodiments.

When such a fabrication process is adopted, then COPs of a silicon substrate are decreased by effecting a nitrogen treatment as well and COPs at the surface of the substrate are remained in a planarized state by removing the oxide film on the surface of the substrate using an etching liquid with which substantially no etching of the silicon substrate occurs.

Further, since in a nitrogen atmosphere as well, similar to the hydrogen atmosphere, since a mobility of Si on a surface of a silicon substrate increases and further, solid solubilities of vacancies and interstitial Si atoms in the substrate increase, therefore COPs at the surface of a silicon substrate are planarized and octahedral cavities in the interior of the silicon substrate become extinct or reduced. Since solid solubilities of interstitial Si and vacancies are determined by A treatment temperature, a treatment temperature is preferred to be higher and a treatment period is preferred to be longer in the nitrogen treatment as well, similar to the case of the hydrogen treatment in the third embodiment. It should be appreciated that an effect of contracting or reducing cavities caused by COPs is small when a treatment temperature is lower than 1000° C., while a surface of a silicon substrate is nitrogenated to become rough when the nitrogen treatment is effected at a temperature as high as beyond 1200° C. Accordingly, a temperature of the nitrogen treatment is preferably in the range of from 1000 to 1200° C.

As described above, according to the present invention, since a surface of a silicon substrate is heated at an oxidation temperature equal to or higher than 1050° C. or heated such as to grow at an oxidation speed equal to or higher than 7.5 nm/min to form a silicon oxide film of a thickness equal to or more than 1500 nm, therefore a corner of each of COPs can be rounded to planarization and further, octahedral cavities that each are a cause for a COP can be reduced, thereby enabling COPs that affect element characteristics in an adverse manner to be reduced. With the reduction and planarization of adversely affecting COPs, an element isolation withstand voltage can be raised even in high integration of a semiconductor device such as DRAM or the like and thereby, not only reliability of a gate oxide film of DRAM can be increased, but a fabrication yield of semiconductor device such as DRAM or the like can be improved.

Further, when a surface of a silicon substrate is subjected to a hydrogen treatment at a temperature in the range of from 1000° C. to 1300° C. or a nitrogen treatment at a temperature in the range of from 1000° C. to 1200° C., planarization of COPs can be effected and COPs that affects device characteristics in an adverse manner can be decreased as well.

Furthermore, since polysilicon films are formed after an oxidation treatment for planarization of COPs; the oxide film and polysilicon film on the surface of a silicon substrate are removed while part of the oxide film on the surface thereof is preserved; and further, the preserved oxide film on the surface of a silicon substrate is removed using an etching liquid with which substantially no etching of the silicon substrate occurs, therefore, COPs to be detected as defects are decreased and a gettering film can simultaneously be formed.

What is claimed is:

1. A fabrication process for a semiconductor device, comprising the steps of:
    oxidizing surfaces of a substrate at a temperature equal to or higher than 1050° C. to form oxide films each of a thickness equal to or more than 1500 nm;
    removing an oxide film formed on a back surface of the substrate by etching;
    depositing polysilicon films on both surfaces of the substrate;
    etching the substrate so as to remove the polysilicon film and the oxide film formed on the surface of the substrate while at least one portion of the oxide film on the surface of the substrate is preserved;
    further etching the substrate using an etching liquid with which substantially no etching of silicon occurs so as to remove the preserved oxide film on the surface of the substrate; and
    thereafter, effecting element isolation on the surface of a substrate.

2. A fabrication process for a semiconductor device, comprising the steps of:
    oxidizing surfaces of a substrate at an oxidation speed equal to or higher than 7.5 nm/min to form oxide films each of a thickness equal to or more than 1500 nm;
    removing an oxide film formed on a back surface of the substrate by etching;
    depositing polysilicon films on both surfaces of the substrate;
    etching the substrate so as to remove the polysilicon film and the oxide film formed on the surface of the substrate while at least one portion of the oxide film on the surface of the substrate is preserved;
    further etching the substrate using an etching liquid with which substantially no etching of silicon occurs so as to remove the preserved oxide film on the surface of the substrate; and
    thereafter, effecting element isolation on the surface of a substrate.

3. A fabrication process for a semiconductor device according to claim 1, wherein an oxide film is removed by etching after formation of the oxide films.

4. A fabrication process for a semiconductor device according to claim 3, wherein the etching liquid with which substantially no etching of silicon occurs is hydrofluoric acid.

5. A fabrication process for a semiconductor device according to claim 3, wherein a density of pits existing at the surface of a substrate after the etching is equal to or less than a density of pits prior to the oxidation treatment.

6. A fabrication process for a semiconductor device according to claim 3, wherein the depth of a pit existing at the surface of a substrate after the etching is of a value equal to or less than 50 nm.

7. A fabrication process for a semiconductor device, comprising the steps of:
    giving a substrate a hydrogen treatment at a temperature ranging from 1000° C. to 1300° C.;
    forming oxide films on both surfaces of a substrate after the hydrogen treatment;
    depositing polysilicon films on both surfaces of the substrate;
    etching the substrate so as to remove the polysilicon film and a portion of the oxide film formed on a surface of a substrate while at least one portion of the oxide film on the surface of a substrate is preserved;
    further etching the substrate using an etching liquid with which substantially no etching of silicon occurs so as to remove the preserved oxide film on the surface of a substrate; and
    effecting element isolation of the surface of a substrate.

8. A fabrication process for a semiconductor device according to claim 7, wherein a density of pits existing at the surface of a substrate after etching off the preserved oxide film on the surface of a substrate is equal to or less than a density of pits prior to the hydrogen treatment.

9. A fabrication process for a semiconductor device according to claim 7, wherein a depth of a pit existing at the surface of a substrate after etching off the preserved oxide film on the surface of a substrate is of a value equal to or less than 50 nm.

10. A fabrication process, comprising the steps of:

forming a silicon oxide film on a surface of a substrate or silicon oxide films on both surfaces of the substrate;

giving the substrate a nitrogen treatment at a temperature ranging from 1000° C. to 1200° C.;

removing an oxide film formed on a back surface of a substrate by etching after the nitrogen treatment step;

depositing polysilicon films on both surfaces of the substrate;

etching the substrate so as to remove the polysilicon film and the oxide film formed on the surface of a substrate while at least one portion of the oxide film on the surface of a substrate is preserved;

further etching the substrate using an etching liquid with which substantially no etching of silicon occurs so as to remove the preserved oxide film on the surface of a substrate; and thereafter, effecting element isolation of the surface of a substrate.

11. A fabrication process for a semiconductor device according to claim 10, wherein a density of pits existing at the surface of a substrate after etching off the preserved oxide film on the surface of a substrate is equal to or less than a density of pits prior to the nitrogen treatment.

12. A fabrication process for a semiconductor device according to claim 10, wherein a depth of a pit existing at the surface of a substrate after etching off the preserved oxide film on the surface of a substrate is of a value equal to or less than 50 nm.

* * * * *

UNITED STATES PATENT AND TRADEMARK OFFICE
CERTIFICATE OF CORRECTION

PATENT NO. : 6,448,157 B1
DATED : September 10, 2002
INVENTOR(S) : Okonogi et al.

It is certified that error appears in the above-identified patent and that said Letters Patent is hereby corrected as shown below:

Title page,
Item [57], ABSTRACT,
Line 4, "when" should be -- When --.

Column 3,
Line 58, "Cops" should read -- COPs --.

Column 8,
Line 54, "Or" should read -- or --.

Signed and Sealed this

Fourth Day of May, 2004

JON W. DUDAS
*Acting Director of the United States Patent and Trademark Office*